US011731322B2

(12) United States Patent
Atzinger et al.

(10) Patent No.: US 11,731,322 B2
(45) Date of Patent: Aug. 22, 2023

(54) METHOD OF MAKING A BUILDING PANEL AND THE PANEL

(71) Applicant: Parat Beteiligungs GmbH, Neureichenau (DE)

(72) Inventors: Philip Atzinger, Hauzenberg (DE); Tobias Schmid, Neureichenau (DE)

(73) Assignee: PARAT BETEILIGUNGS GMBH, Neureichenau (DE)

( * ) Notice: Subject to any disclaimer, the term of this patent is extended or adjusted under 35 U.S.C. 154(b) by 486 days.

(21) Appl. No.: 16/402,281

(22) Filed: May 3, 2019

(65) Prior Publication Data
US 2020/0023565 A1   Jan. 23, 2020

(30) Foreign Application Priority Data

Jul. 18, 2018  (DE) .......................... 102018117337.7
Apr. 12, 2019  (DE) .......................... 202019102123.3

(51) Int. Cl.
*B29C 44/12* (2006.01)
*B29C 44/44* (2006.01)
(Continued)

(52) U.S. Cl.
CPC ........ *B29C 44/1271* (2013.01); *B29C 44/445* (2013.01); *B29C 44/46* (2013.01);
(Continued)

(58) Field of Classification Search
CPC ............. H01L 31/0481; H01L 31/0488; B29C 44/1257; B29C 44/1266; B29C 44/1271;
(Continued)

(56) References Cited

U.S. PATENT DOCUMENTS 3,666,850 A * 5/1972 Windecker .............. B65B 55/20
                                                    264/53
4,830,038 A   5/1989 Anderson et al.
(Continued)

FOREIGN PATENT DOCUMENTS

DE         3842846 A1    6/1990
DE    102009031341 A1 *  1/2011  ......... B29C 44/1238
(Continued)

OTHER PUBLICATIONS

Machine Translation of WO-2017109079-A1, obtained from Espacenet on Sep. 23, 2022. (Year: 2017).*

*Primary Examiner* — Atul P. Khare
(74) *Attorney, Agent, or Firm* — Andrew Wilford (57) ABSTRACT

The invention relates, among other things, to a method of making a thin panel (10) for outdoor applications, comprising, among other things, the following steps:
  a) providing a deep-drawable film (10) of a transparent plastic,
  b) deep-drawing the film (11) in a mold (34),
  c) mounting a structure (19) having solar cells (32) on an inner face (16) of the deep-drawn film (12),
  d) placing the deep-drawn film (12) with mounted structure (19) in a cavity (33) of a mold (34) having in particular at least two mold halves (13, 14),
  e) introducing a liquid polyurethane casting compound (24) into the cavity (33) of the mold (34) and spreading the polyurethane casting compound (24) over an inner face (18) of the structure (19) and/or over the inner face (16) of the film (12),
  f) curing the polyurethane casting compound, in particular with the mold closed, to form a reinforcement layer (30), or comprising the following steps j) and k) instead of the steps e) and f):
(Continued)

j) introducing a granular particle foam mass into the cavity (33) of the mold (34) and spreading over an inner face (18) of the structure (19) and/or over the inner face (16) of the film (12), k) baking and curing the particle foam mass, in particular with the mold closed, to form a reinforcement layer (30).

13 Claims, 7 Drawing Sheets

(51) Int. Cl.

| | |
|---|---|
| B29C 51/08 | (2006.01) |
| B29C 44/56 | (2006.01) |
| B29C 70/02 | (2006.01) |
| B29C 70/68 | (2006.01) |
| B29C 44/46 | (2006.01) |
| B29C 70/78 | (2006.01) |
| B60K 16/00 | (2020.01) |
| H01L 31/048 | (2014.01) |
| H01L 31/02 | (2006.01) |
| B29C 51/26 | (2006.01) |
| H01L 31/04 | (2014.01) |
| B29C 33/38 | (2006.01) |
| B32B 27/40 | (2006.01) |
| B29K 75/00 | (2006.01) |

(52) U.S. Cl.
CPC ........ B29C 44/5681 (2013.01); B29C 51/082 (2013.01); B29C 51/266 (2013.01); B29C 70/021 (2013.01); B29C 70/682 (2013.01); B29C 70/78 (2013.01); B60K 16/00 (2013.01); H01L 31/02013 (2013.01); H01L 31/0481 (2013.01); B29C 2033/385 (2013.01); B29K 2075/00 (2013.01); B32B 27/40 (2013.01); B32B 2250/24 (2013.01)

(58) Field of Classification Search
CPC ..... B29C 44/129; B29C 44/146; B29C 70/78; B29C 44/3415; B29C 44/44; B29C 44/445

See application file for complete search history.

(56) References Cited

U.S. PATENT DOCUMENTS

| | | | |
|---|---|---|---|
| 6,653,553 B2 * | 11/2003 | Reimer | B60J 7/00 136/244 |
| 8,841,545 B2 | 9/2014 | Wakayama et al. | |
| 9,168,710 B2 | 10/2015 | Kornexl | |
| 2003/0006519 A1 * | 1/2003 | Kopp | B29C 44/445 428/34.1 |
| 2004/0258888 A1 * | 12/2004 | Ludwig | B29C 45/14688 428/158 |
| 2006/0105650 A1 | 5/2006 | Yeh | |
| 2011/0155222 A1 | 6/2011 | Ebbing et al. | |
| 2011/0226312 A1 | 9/2011 | Boehm et al. | |
| 2011/0262703 A1 * | 10/2011 | Legler | B29C 70/086 428/156 |
| 2012/0237759 A1 | 9/2012 | Ebbing et al. | |
| 2019/0084428 A1 | 3/2019 | Ebert et al. | |
| 2020/0094449 A1 * | 3/2020 | Prinz | B29C 44/08 |
| 2020/0324445 A1 * | 10/2020 | Prinz | B29C 44/14 |

FOREIGN PATENT DOCUMENTS

| | | |
|---|---|---|
| DE | 102010010828 A1 | 9/2011 |
| DE | 102011121321 A1 | 12/2011 |
| DE | 102011109701 A1 | 2/2013 |
| DE | 102012017698 A | 12/2013 |
| DE | 102013005523 A | 12/2013 |
| DE | 102013008592 A | 12/2013 |
| DE | 102013008364 A | 8/2014 |
| DE | 102013018694 A | 5/2015 |
| DE | 102015109897 A | 1/2016 |
| DE | 102015111052 A | 1/2017 |
| DE | 102016112290 A | 1/2018 |
| DE | 102017109953 A | 11/2018 |
| EP | 0477476 A2 | 4/1992 |
| JP | 2002178359 A | 6/2002 |
| WO | WO-2017109079 A1 * | 6/2017 ............ B29C 33/06 |

* cited by examiner

METHOD OF MAKING A BUILDING PANEL AND THE PANEL

The invention first relates to a method of making a building panel for outdoor applications.

Such manufacturing methods have been performed by the Applicant for some time.

Such panels are referred to as building panels for outdoor applications in the context of the present patent application that have an arbitrary three-dimensional shape and for example flat sections and/or curved sections in space and that have a wall thickness that is an extension in a Z direction that is essentially smaller than the extension of the panel in the X and Y directions. The wall thickness extending in the Z direction that is perpendicular to the X and Y directions is approximately one fifth to one five-hundredth of the length of the panel in the X direction or the width in the Y direction of the panel in the case of such building panels.

The panel to be made according to the invention is intended for outdoor application: This means that the panel is placed or positioned in the exterior when used as intended.

In particular, using the method according to the invention, panels can be made which are configured as a roof element, as a side wall element, as an engine hood, as a trunk lid, as a fender or as a trim part for a vehicle. Cars, commercial vehicles, caravans, trailers, mobile homes, agricultural machinery, construction machinery and construction vehicles or the like vehicles are in particular considered vehicles.

The Applicant has a great deal of expertise in the field of production of such panels. In particular, reference is made to the earlier patent applications of the Applicant under the file numbers DE 10 2017 109 953 A1, DE 10 2016 112 290 A1; DE 10 2015 109 897 A1, DE 10 2013 018 694 A1, DE 10 2013 008 592 A1, DE 10 2013 005 523 A1, DE 10 2013 008 364 A1, DE 10 2015 111 052 A1, DE 10 2012 017 698 A1 and DE 10 2012 014 689 [U.S. Pat. No. 9,168,710], whose content is hereby included in the content of the following patent application also for the purpose of reference to individual features.

In the course of the revolutions in the drive technology of vehicles, namely the decrease in the proportion of internal combustion engines and the increase in the proportion of electric motors, the production of electrical energy is becoming more important.

There is therefore a need to equip parts of vehicles with solar cells in order to capture as extensively as possible sunlight or electromagnetic radiation from the sun and convert it into electrical energy in order to supply this electrical energy either to electrical consumers of the vehicles or to temporarily store the energy in accumulators.

In this case, according to a known approach, the approach pursued is to subsequently affix a solar cell module to an existing vehicle. However, there are numerous related disadvantages.

The object of the invention is to further develop a method known per se for the manufacture of a building panel in such a way that an integration of solar cells into the panel can be achieved in an efficient and process-reliable manner of production.

The invention achieves the object with the features of claim 1.

The principle of the invention is to first deep draw a deep-drawable film in a mold. As a result of the deep-drawing operation, the deep-drawn film obtains a three-dimensional shape which corresponds to or essentially corresponds to the three-dimensional shape of the panel to be finished. The outer side of the deep-drawn film thus has, after the deep-drawing operation, a three-dimensional shape which corresponds to the three-dimensional shape of the outer side of the building panel to be finished.

The film consists of a transparent plastic. Transparent means that the film is permeable to at least one spectral range of the electromagnetic radiation emitted by the sun.

In particular, materials such as polycarbonate or PMMA are considered according to the invention. The deep-drawing operation can be carried out with the aid of a lower mold and an upper mold. Alternatively, for example, blow-molding methods, in which the deep-drawn film is heated before the actual deep-drawing blowing operation, are considered for the implementation of the deep-drawing operation.

In the initial state, the deep-drawable film can have, for example, a wall thickness between 0.01 mm and 10 mm, preferably between 0.5 mm and 3 mm.

In a second method step, according to the invention, after the deep-drawing of the film, a structure having solar cells is mounted to the inner face of the deep-drawn film. The inner face of the film and the outer side of the film and the corresponding inner faces and outer sides of the elements and layers to be described later relate to the position of use of the finished made panel: The outer side of the panel and accordingly the outer side of the deep-drawn film, in the use state of the panel, faces the exterior, thus, for example, the sun, and the inner face, for example, faces the interior of the vehicle or the interior of the motor compartment of the vehicle.

The structure to be mounted to the inner face of the deep-drawn film can comprise one or more layers or modules of or with solar cells which are capable of converting electromagnetic radiation emitted by the sun into electrical energy. The solar cells can also be embedded in a composite structure. For example, the structure can comprise solar cells that are embedded in a matrix of plastic or completely or partially enveloped by such a matrix. According to the invention, composite constructions which consist of solar cells and other materials can also be considered for providing such a structure.

In particular, the structure is provided as a handleable unit that is mounted directly on the inner face of the deep-drawn film, for example, can be glued thereon. The invention also comprises when the structure consists exclusively of solar cells that are mounted with or without the interposition of an adhesive layer on the inner face of the deep-drawn film, and by a carrier layer, for example, an adhesive film that covers or overlays the inner face the solar cells, is glued to the inner face of the deep-drawn film.

Other mounting methods for mounting such a structure to the film are also encompassed by the invention.

Conceivable, and also encompassed by the invention, is also when the solar cells are mounted directly to the deep-drawn film, for example, by layer growth, or are mounted epitaxially or by vapor deposition or by other suitable methods.

According to an advantageous embodiment of the invention, it is provided that the structure having the solar cells is mounted to the deep-drawn film by performing a step of vacuum lamination. In particular, the formation of air bubbles can be avoided in this way. Also, this method allows a simple and secure crack-free mounting of the structure to the film.

According to the invention, it is provided in a further step that the deep-drawn film with structure mounted thereto is arranged in a cavity of a mold. The mold preferably has two mold halves, namely a lower mold and an upper mold.

Advantageously, the deep-drawn film is arranged with the mounted structure in the lower mold.

Then, in a further method step according to an alternative of the invention, a liquid polyurethane casting compound is introduced into the cavity of the mold.

This polyurethane casting compound is spread over the inner face of the structure or over the inner face of the film.

In the case where the inner face of the film is provided with a structure over the entire surface, that is, completely, the liquid polyurethane casting compound is spread only over the inner face of the structure.

In the case where the inner face of the film is only partially provided with structure, the polyurethane casting compound is spread over the inner face of the structure and over the inner face of the film. A distribution of the polyurethane casting compound can either be carried out by this actively, for example, an application device, for example, a movable mixing head, moving over the inner face of the deep-drawn film and successively releasing liquid polyurethane casting compound, and thus achieving a pre-distribution or distribution. The invention also comprises, however, when the polyurethane casting compound is spread independently or essentially independently over the inner face of the structure or the inner face of the film due to a flow operation.

According to a further method step of the invention, the polyurethane casting compound is then cured. The polyurethane casting compound is brought to curing in particular with the mold closed. In this case, while maintaining appropriate pressure ranges and preferably under the action of predetermined temperatures, for example, by heating the mold, the reaction time of the polyurethane casting compound, which is required to complete or almost complete curing, can be determined exactly, so that the cycle times can be accurately predetermined and optimized. The polyurethane casting compound cures to form a reinforcement layer of the panel. After curing the curing, the panel finished in this way can be removed from the mold or from the mold form.

Of course, the finished panel removed from the mold can be subjected to still further processing steps: For example, overhangs that arise as a result of the deep-drawing operation or as a result of the foam-filling operation, are detached or milled. Cleaning steps, surface processing steps or painting steps can also be provided.

The panel made by the method according to the invention is lightweight construction and rigid due to the proposed reinforcing layer. The structure with the solar cells is accommodated protected, protected by the film. The deep-drawn film mounted to the outer side of the solar cell transmits the light, so that the efficiency of the solar cell is not impaired. The surface property of the building panel to be finished can be determined by the material properties of the deep-drawable film.

The mechanical properties of the building panel are decisively co-influenced by the cured reinforcing layer.

The panel made according to the invention can be mounted and used in the same or almost the same way as conventionally configured panels.

For example, stiffening structures, such as stiffening ribs or stiffening zones can also be provided on the panel.

Receptacles, for example, for screw elements, for mounting hinges, fastening means or the like, can also be integrated into the panel.

According to an alternative of the invention, instead of the above-described steps e) and f) of claim 1, that is, instead of introducing a liquid polyurethane casting compound into the mold and a curing of the polyurethane casting compound, according to the steps j) and k) of claim 1, the following is undertaken:

In the method according to the invention according to this alternative, a granular particle foam mass is first introduced into the cavity of the mold according to step j). A granular particle foam mass in the context of the invention is a granular starting material in the form of loose particles. The particles are therefore not firmly connected to each other, especially not baked to each other. In question are foamable particle foams such as EPS, EPE, or PEEK or other suitable foams.

The granular particle foam mass, for example, can be partially foamed in an oven or in a pre-foaming device, for example, an infrared baking oven, and be finally foamed in the mold. The invention also comprises when the granular starting material is already finally foamed or fully foamed, and is merely baked in the mold. Furthermore, the invention comprises when the granular material of the particle foam mass is introduced into the mold pre-foamed or finally foamed, and the mold is overloaded. The term overloaded mold in particular comprises embodiments in which the volume of the granules introduced into the mold, that is, the granular particle foam mass, exceeds the volume of the cavity of the mold. Here, therefore, a certain compression takes place when performing the subsequent step of baking.

According to step j) of the alternative of the invention, the granular particle foam mass is spread over an inner face of the structure and/or over the inner face of the film. Such a distribution can be carried out independently, for example, by aligning the granular particles themselves present in the form of spheres or beads along the bottom surface of the cavity of the mold. Alternatively, the granular particles are spread automatically or manually, for example, by smoothing out the particles. Also, for example, appropriate control or guide surfaces or also a blower device or other apparatuses for generating air currents, can provide a uniform distribution of the granular particles in the course of the closing of the mold by means of a suitable device. Also, the granular particle foam mass can be spread or pre-spread after introduction into the cavity of the mold with the aid of a device which discharges the granular particle foam mass, and which is displaceable relative to the mold, in particular displaceable along an XY plane.

According to this alternative of the invention, in a step k), the granular particle foam mass is baked that then cures. The step of baking is carried out in particular under the influence of temperature. The mold is advantageously heated for this purpose. In this case, the mold can also be exposed to a thermal cycling, so that initially the temperature required for a baking of the granular particle foam mass, for example, 80° C. or 160° C., is reached, and then a temperature change of the mold is carried out in order to reach a temperature below the melting point of the baked particle foam mass.

The step of baking and curing of the particle foam mass is advantageously carried out with the mold closed. The foam can be held in this way, in particular against a foam pressure, if the granular particle foam mass finally fills with foam. A particularly homogeneous formation of the reinforcement layer can be achieved in this way.

The particle foam mass provides a reinforcement layer after the curing has been allowed.

Suitable expandable particle foams, for example, particle foams of EPS, EPE and EPP, come into question. These are particle foams that can have densities in the fully or finally filled with foam and cured state in the range of typically 15 kg/m3 to 80 kg/m3.

The method according to the invention provides that granular starting material is provided in the form of loose particles of a foamable particle foam. Those materials that are known as expandable particle foams thus come into question. In particular, this is understood as meaning expandable particle foams of EPS, EPE, or EPP, or also expandable PEEK. A further definition is given below.

The granular starting material can be provided in the used form of small spherules or beads or in the form of granular particles of other regular or even irregular shape and geometry. The starting material is in particular pourable.

The particles are loosely present in the granular starting material, that is, in particular, they are not yet firmly bonded to each other.

According to a variant of the invention, the first step carries out a partial foaming of the particles. The partial foaming means that the particles are not yet completely foamed. For example, it can be provided according to the invention that based on a foaming or expansion operation from 0 to 100%, a partial foaming takes place between 30 and 95%, starting from the volume of the particles of the starting material to the volume of the particles in the final foamed state. The term partial foaming comprises, in particular, embodiments of the invention in which at least the step of additional foaming of the particles can still be performed, leading to a final foamed state of the particles.

The step of partial foaming is in particular, but not necessarily, carried out at a location remote from the lower mold in which the substrate is arranged. Further advantageously, the partial foaming of the particles can be performed in an oven, in particular in an infrared oven.

According to a further step of this variant of the method according to the invention, it can be provided that the partially foamed particles are passed into the lower mold. The transport of the partially foamed particles can be performed, for example, temporally immediately after performing the step of partially foaming the particles. However, it can also be performed temporally considerably later after performing the step of partially foaming the particles.

Bringing and/or arranging or positioning the partially foamed particles in the lower mold can be carried out by mechanically, automatically, or manually.

According to this variant of the invention, the mold is now closed in particular. For this purpose, for example, an upper mold can travel against the lower mold and close a receiving space or accommodation space for the partially foamed particles, and for the film located in the lower mold.

Furthermore, the mold is heated, according to the invention. The invention also encompasses when the mold is constantly maintained at a constant temperature or at a temperature within a predetermined temperature range.

According to the invention, a final foaming of the previously already partially foamed particles to a completely foamed particle foam is then carried out. The particles now extend to their maximum extent or to their maximum volume, and bake or sinter to each other, so to speak. In this case, the particle foam compound combines with the substrate at the same time. The activation of the residual foaming operation is carried out via the mold temperature. The invention also comprises when additionally or alternatively other activating agents are used for activating and performing the residual foaming operation of the particles, that is, for the foaming operation of the already partially foamed particles up to a final foamed state of the particles.

According to the invention, curing of the particle foam mass is then allowed. As a result of this curing operation, the particle foam mass with the film, that is, with the substrate, forms a permanent solid compound.

The invention also comprises when the film is provided with a corresponding chemical, for example, in the manner of a primer, on its inner face facing the foam particle mass before the introduction of partially foamed particles into the lower mold in order to optimize the connection between the film and the particle foam mass or assuming of the connection between the film and the particle foam mass.

After the particle foam mass has been cured, the mold can be opened and the molded article thus formed can be removed. The molded article formed thus represents the panel to be finished according to the invention, or can mature to such a panel by subsequent processing steps.

Definition of Expandable Particle Foam:

In the context of the present patent application, the following materials are considered as expandable particle foams, for example:

The abbreviation EPS denotes expandable polystyrene. This is known, for example, under the trade name Styrofoam, and can, for example, be obtained from the company Metz EPS-Hartschaumzuschnitte in 74376 Gemmrigheim.

In the context of the present patent application, expandable polyethylenes (EPE) are also considered to be particle foam. Finally, expandable polypropylenes (EPP) are also considered to be well suited for the purposes of the invention.

In particular, the term particle foam in the context of the present patent application comprises thermoplastic particle foams. As starting materials, these can have granules, in particular also microgranules, for example, having diameters of the particles in the order of magnitude of between 0.1 and 5 mm, more preferably particles having a diameter of approximately 1 mm.

Propellants are preferably arranged in the granular starting material particles of the particle foam. These can be activated thermally and/or by chemicals, for example, by the action of water vapor, to trigger the pre-foaming process.

The operation of residual foaming, that is, the final foaming of already pre-foamed particles into finally foamed particles, is also referred to as sintering in the context of the present patent application.

For example, pentane, which is polymerized into the granular particles, is considered a suitable propellant for polystyrene particle foam particles. As the particles are exposed to temperatures in excess of 100° C., the propellant can evaporate, thereby inflating the thermoplastic base material into polystyrene foam particles.

According to the invention, the second foaming stage can be carried out in the lower mold, wherein the mold temperature is selected such that the propellant can finally vaporize, and the particles can finally fill with foam.

XPS is also suitable for the invention, in addition to EPS (extrudable polystyrene).

For example, the company Schaumaplast GmbH & Co. KG in 68799 Reilingen is considered a reference source for expandable polypropylene EPP or XPS.

Particle foams for use in the manufacturing method according to the invention can also be provided by expandable copolymers. Such materials are obtainable, for example, under the trade name Grupor from Kunststoffwerk Katzbach GmbH & Co. KG in 93413 Cham.

Expandable PEEK (polyether ether ketone) can also be considered as the starting material of the particle foam which can be used in the context of the invention. This is available, for example, under the trade names Gatone or Victrex.

The invention comprises, in addition to the last-described granular particle foam masses that are initially pre-foamed and later finally foamed, materials that are present as granular particle foam mass in already final foam-filled state, and are only baked in the mold, thus are sintered.

According to an advantageous embodiment of the invention, the film consists of polycarbonate or PMMA. This allows a fallback to conventional materials and the empirical values resulting therefrom.

According to a further advantageous embodiment of the invention that comprises step e), the polyurethane casting compound comprises reinforcing fibers. The reinforcing fibers can in particular comprise short or long fibers. Reinforcing fibers can be of carbon, aramid, glass or other material, for example.

According to a further advantageous embodiment of the invention, the structure can be glued on the inner face of the deep-drawn film. An advantageous and simple manufacture is possible as a result. There is the possibility that the structure provides a handling unit that, for example, as a whole, in a simple manner, can be glued on the inner face of the deep-drawn film.

According to a further advantageous embodiment of the invention, the following step h) is performed before step e) or before step j):

introducing a liquid barrier layer casting compound, in particular of polyurethane, into the cavity of the mold and spreading the barrier layer casting compound over an inner face of the structure and/or over the inner face of the film.

According to this embodiment of the invention, a barrier layer casting compound is firstly mounted to the deep-drawn film provided with the structure on the inner face. This, in turn, can cure with the mold closed or alternatively when the mold is open.

In this context, it is advantageous, in particular, when following step h), step e) of introducing a liquid polyurethane casting compound or step j) of introducing a granular particle foam mass to provide a reinforcement layer is carried out only when the barrier layer casting compound is cured. By curing the barrier layer casting compound, structures such as fabric mats, reinforcing fibers or the like can not be seen in the reinforcement layer.

According to a further advantageous embodiment of the invention, the following step i) is performed before step e):

introducing a liquid in-mold-paint casting compound into the cavity of the mold and spreading the in-mold-paint casting compound over an inner face of the structure and/or over the inner face of the film.

In this step, before the introduction of the liquid polyurethane casting compound or before the introduction of the granular particle foam mass, an in-mold-paint casting compound is mounted to the inner face of the deep-drawn film and the structure. This is a paint or varnish application that is relevant to the overall coloring of the panel. In this context, it is noted that the solar cells can also be configured transparent, and therefore the coloring of the panel is determined or co-determined by this in-mold-paint casting compound.

Further preferably, it is provided that following step i), either directly step e) or directly step j) is carried out, or previously additionally step h) is carried out. Furthermore, it is advantageously provided that, after step i) and before performing steps h) and/or e) or j), it is initially provided to wait until the in-mold-paint casting compound has cured.

According to a further advantageous embodiment of the invention, the deep-drawing operation according to step b) is carried out in a first mold and the arranging of the deep-drawn film with mounted structure and the introduction of the polyurethane casting compound and the curing of the polyurethane casting compound according to steps d) to f) or the introduction of the granular particle foam mass and their baking in a second mold. It can be provided as a variant that the first mold and the second mold are provided by the same mold. According to an alternative, it can be provided that the first mold and the second mold are provided by two different molds. In the latter case, it is provided according to the invention that the deep-drawn film with structure mounted thereto is passed from the first mold into the second mold after step b).

According to a further advantageous embodiment of the invention, electrical lines are provided that are connected to the structure. Electrical lines serve to connect the solar cells to an accumulator, or to an electrical or electronic panel or directly to an electrical consumer.

It is advantageously provided that at least a section of the lines passes through the reinforcement layer.

For this purpose, for example, a passage for the electrical lines can be provided in the reinforcement layer. This allows a placement of a connection for the electrical lines on the inner face of the finished panel. For example, contacts, plugs, sockets or other, possibly also standardized, connection elements can be provided for this purpose. For example, corresponding connection sockets can be arranged in the reinforcement layer, wherein corresponding receiving spaces or receiving compartments for connecting elements, in particular for contacts or plug connectors, can be provided in the reinforcement layer.

According to a further advantageous embodiment of the invention, at least a section of the lines passes through the film. In this way, if necessary, a connection to the electrical lines on the outer side of the panel is carried out, for example, in the region of attachments, such as hinges or other attachments, preferably in an edge region of the panel.

According to a further advantageous embodiment of the invention, the film has a passage for the electrical lines.

According to a further advantageous embodiment of the invention, the panel is an exterior panel for a vehicle, such as cars, commercial vehicles, trailers, agricultural machinery or the like and forms a roof element, a side wall element, an engine hood, a trunk lid, a fender or a trim part for this vehicle.

According to an advantageous embodiment of the invention, it is provided that the barrier layer casting compound is provided by a polyurethane, in particular by an aromatic polyurethane, wherein in particular reinforcing materials, more particularly mineral reinforcing materials, such as talc or chalk are added.

The invention relates, according to a further aspect, to a panel according to claim 16.

The invention has for its object of providing a panel which is easy to manufacture and solar cells integrated into the panel in a functionally reliable and functionally safe manner.

The invention achieves the object with the features of claim 16.

To avoid repetition, it is pointed out that the arguments and statements made with regard to the above statements on claims 1 to 15 equally apply to the features and explanations of the panel according to claim 16.

Likewise, it is pointed out that a panel according to claim 16 can have one or more or all of the features or feature combinations of the type previously described in connection with the method of manufacture.

Further advantages of the invention become apparent from the non-cited subclaims and with reference to the following description of the embodiments illustrated in the drawings. Shown are:

FIG. 1 schematically, in a partially sectioned view, a deep-drawable film before the deep-drawing operation, FIG. 2 in a partially sectioned representation, a mold having lower mold and upper mold and the film of FIG. 1 deep-drawn in the mold, wherein the mold is shown open, and the deep-drawn film is shown slightly spaced from the lower mold, FIG. 3 the deep-drawn film of FIG. 2 in a single representation with structure having solar cells mounted to the inner face thereon, FIG. 4 the deep-drawn film with mounted structure in an open mold, having a lower mold and an upper mold, wherein a mixing head is moved schematically shown in a cavity of the opened mold, which mixing head dispenses a liquid polyurethane casting compound and distributes on the inner face of the deep-drawn film and on the inner face of the structure, FIG. 5 the finished made panel, still located in the closed mold form after the curing of the casting compound, FIG. 6 in a partially sectioned, schematic, enlarged detailed view approximately according to partial circle VI in FIG. 5, a connecting region of deep-drawn film, solar cell and reinforcement layer, FIG. 7 in detailed representation, the finished panel made and removed from the mold form, FIG. 8 a representation according to FIG. 7, a further embodiment of a panel according to the invention with an electrical supply line connected to the structure, FIG. 9*a* in an enlarged detailed view, approximately according to partial circle IX in FIG. 8, a tied-down region of the electrical supply lines to the solar cells and the passage in the reinforcement layer, FIG. 9*b* a further embodiment of a panel according to the invention in a representation analogous to FIG. 9*a*, wherein in this embodiment, a channel is provided for the passage of electrical lines to the solar cells in the deep-drawn film, FIG. 10 in an enlarged detailed representation according to partial circle X in FIG. 7, the layer structure of a panel made according to the invention, FIG. 11 in a representation according to FIG. 10, the layer structure of a further embodiment of the panel according to the invention, FIG. 12*a* in a representation according to FIG. 10, the layer structure of a further embodiment of the panel according to the invention, FIG. 12*b* in a representation according to FIG. 10, a further embodiment in which the layer structure of the panel has an in-mold-paint casting compound and a barrier layer casting compound, FIG. 13 in a representation according to FIG. 10, the layer structure of a further embodiment of the panel according to the invention, FIG. 14 in a simplified, schematic representation, a container into which an unfoamed granular particle foam mass is filled, FIG. 15 in a schematic representation similar to FIG. 14, the container and additionally a schematically shown foaming device, in particular in the form of an infrared oven, wherein the unfoamed granular particles of FIG. 14 are configured partially foamed or finally foamed and with respect to the representation of FIG. 14, have significantly increased volumes, FIG. 16 a further embodiment of the invention in a representation according to FIG. 4, wherein the deep-drawn film with structure mounted thereto already described based on the previous embodiments is arranged in an opened mold and is inserted into the lower mold, wherein the mold is opened, and the upper mold is spaced from the lower mold, and wherein a granular particle foam mass consisting of foamed particles is introduced into the cavity of the mold, and is spread over the inner face of the deep-drawn film and over the inner face of the structure, FIG. 17 the embodiment of FIG. 16 in a representation according to FIG. 5, wherein the finished made panel still in the closed mold form is shown after the curing of the granular particle foam mass, wherein for explanation, additionally with respect to the representation of FIG. 5, heating is indicated that tempers the mold, and FIG. 18 in a representation according to FIG. 7, the finished made panel of FIG. 17 that is removed from the mold form in a detailed representation.

Embodiments of the invention are described by way of example in the following description of the figures, also with reference to the drawings. For reasons of clarity, identical or comparable parts or elements or regions are also designated with the same reference numerals, sometimes with the addition of small letters, even if different embodiments are involved.

Features which are described only in relation to one embodiment can also be provided in the context of the invention in any other embodiment of the invention. Such modified embodiments are comprised by the invention, even when they are not shown in the drawings.

All disclosed features are essential to the invention. In the disclosure of the application, the disclosure content of the associated priority documents (copy of the prior application) and the cited references and the described devices of the prior art are hereby incorporated in full, also for the purpose, to include individual or multiple features of these documents in one or more claims of the present application.

First, the family of embodiments according to FIGS. 1 to 13 are explained according to a first aspect of the invention. These are embodiments which are finished by performing steps e) and f) of claim 1, and require corresponding methods.

The panel according to the invention is designated by the reference numeral 10 in the drawings as a whole.

Figure 7:
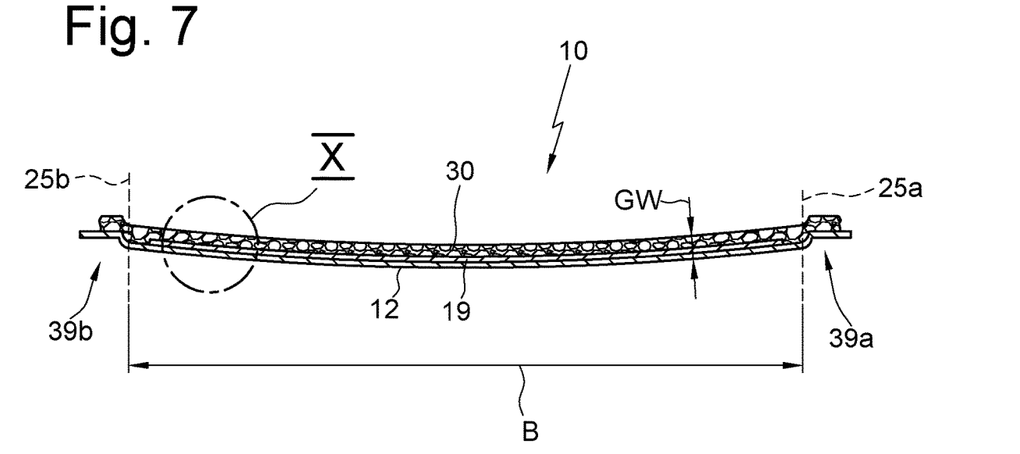

Such a panel is shown in the finished made state in FIG. 7 in a solo representation. The panel consists of different layers 12, 19, 30 that are explained in detail later. It should first be pointed out that the panel 10 is configured altogether planar and therefore has a total wall thickness GW which is significantly smaller than the width B of the panel 10. The length L of the panel in a direction transverse to the plane of the paper of FIG. 7 lies in the order of magnitude of the width B and is thus also considerably larger than the total wall thickness GW.

The width B and the length L can be, for example, 5 to 1000 times the total wall thickness GW.

Figure 1:
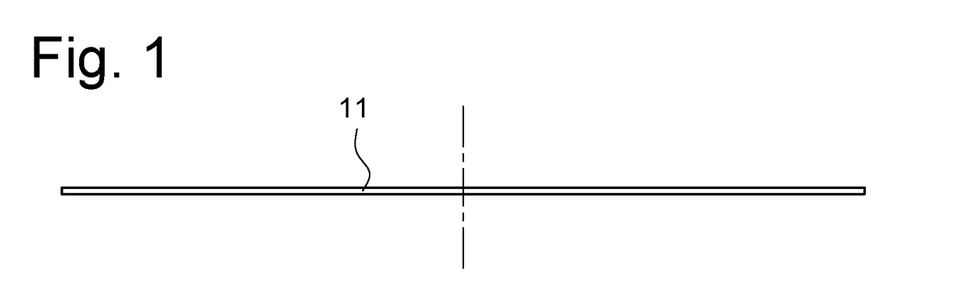

To manufacture the panel 10 according to FIG. 7, the procedure is as follows:

Starting from FIG. 1, a deep-drawable film 11 is first provided. This has a wall thickness W1 (FIG. 10) which, for example, is between 0.1 mm and 10 mm, preferably between 0.5 mm and 3 mm. The deep-drawable film 11 consists of a transparent, that is, see-through material which allows transmission of at least certain spectral ranges of the electromagnetic radiation spectrum emitted by the sun. In particular, polycarbonate or PMMA is considered as a material for the deep-drawable film 11.

Figure 2:
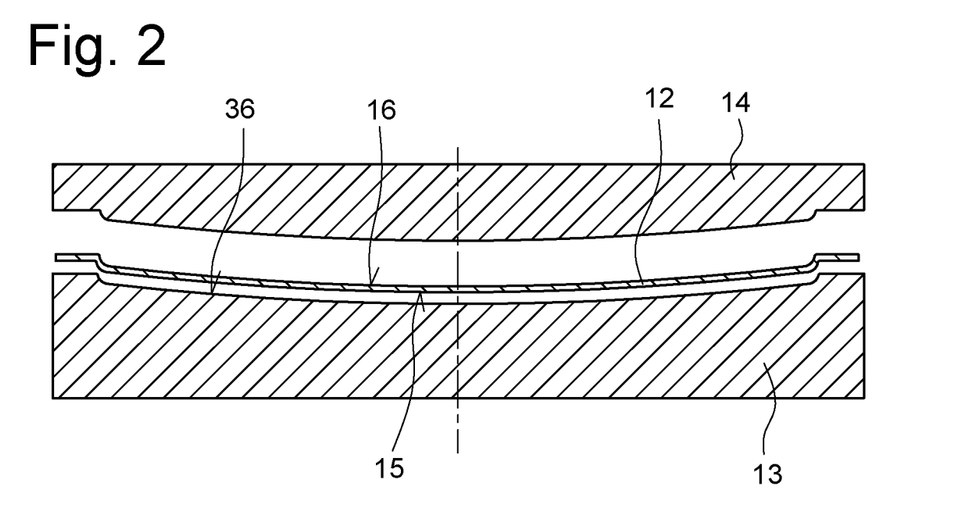

The deep-drawable film 11 is inserted into a mold having a lower mold 13 and an upper mold 14 according to FIG. 2. As a result of a closing operation of the mold, the film 11 can be deep-drawn and reach its deep-drawn mold 12 shown in FIG. 2. In this case, the film is deformed as a result of the deep-drawing operation.

The invention also comprises deep-drawing steps, in which, the shaping of the deep-drawable film 11 is achieved as a result of a blow molding operation, starting from a planar state that lies flat, into the desired three-dimensional shape. The mold 13 can be tempered for this purpose, and for example, suction devices can be present to pull up the outer side 15 of the deep-drawable film 11 to the inner face 36 of the lower mold 13. In such deep-drawing operations that take place in the manner of blowing operations, an upper mold 14 is not or not necessarily mandatory.

FIG. 2 shows a half-opened state of the mold, in which the upper mold 14 is spaced from the lower mold 13.

The deep-drawn film 12 is shown, for illustrative purposes only, slightly spaced from the lower mold 13.

Subsequently, according to a variant of the invention, the deep-drawn film 12 can be removed from the mold. In another variant of the invention, the deep-drawn film 12 can remain in the lower mold 13.

Figure 3:
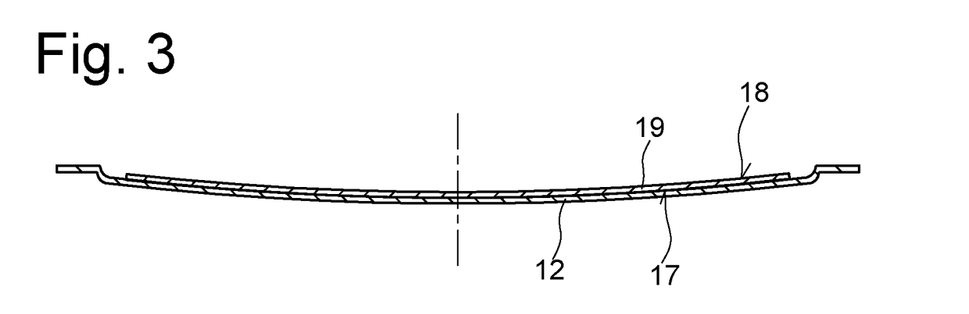

In a further step, a structure 19 having solar cells 32 is now mounted to the inner face 16 of the deep-drawn film 12.

The structure 19 can consist exclusively of solar cells 32, or can comprise solar cells 32. The structure 19 can be provided as a handling unit. In particular, it can be configured as a planar element that can possibly also be conformable to the contour of the inner face 16 of the deep-drawn film 12. The structure 19 can be provided as an adhesive film. In a variant of the invention, the structure 19 can be a composite panel which, in addition to the actual solar cells 32 serving to generate electricity, also comprises plastic panels, carrier materials, substrates or the like on which the solar cells 32 are mounted.

In the simplest case, the structure 19 is mounted to the inner face 16 of the deep-drawn film 12 by means of a gluing operation. For this purpose, the outer side 17 of the structure 19 can be provided with an adhesive layer and/or the inner face 16 of the deep-drawn film 12 can be provided with a corresponding adhesive layer. Alternatively, it is also possible for the structure 19 to be overlaid or covered on its outer side 18 by a carrier material which overlaps the structure 19 on the outer side and is glued to the inner face 16 of the film 12.

The invention also comprises when the mounting of the structure 19 to the deep-drawn film 12 is carried out only for the purpose of achieving a kind of pre-assembly state, so that position retention is achieved only for a short period of time. In one variant of the invention, it is therefore sufficient if the structure 19 is only placed on the inner face 16 of the deep-drawn film for a short time.

According to a further method step, which is explained with reference to FIG. 4, a liquid polyurethane casting compound 24 is mounted to the deep-drawn film 12 with structure 19 mounted thereto. This is carried out according to the invention in a mold 34 that further advantageously comprises a lower mold 13 and an upper mold 14.

In one variant of the invention, the mold 34 can be the same mold shown in FIG. 2, in which the deep-drawing operation has already been performed. In this case, it is not necessary in a variant of the invention that the deep-drawn film 12 is ever removed from the lower mold 13. Also, the mounting of the structure 19 can be carried out directly, with deep-drawn film 12 remaining in the lower mold 13.

Figure 4:
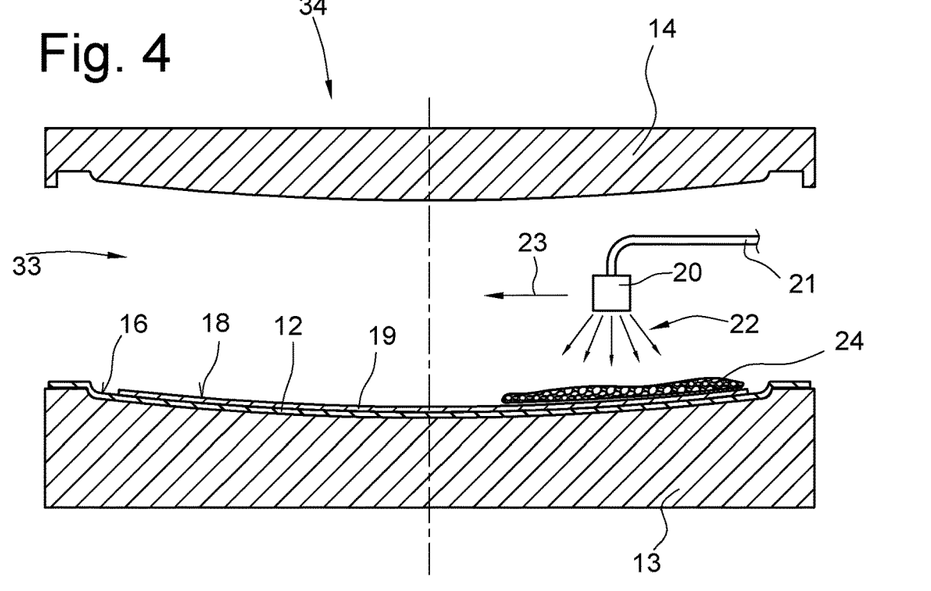

In a variant of the invention, the deep-drawn film 12 is removed from the mold shown in FIG. 2 after the deep-drawing operation and has been passed into the mold 34 in FIG. 4 and has been introduced into the cavity 33 of the mold 34 shown there. An mounting of the structure 19 to the deep-drawn film 12 can be carried out in a cavity 33 of the mold 34 in this embodiment, or in a further variant of the invention, even outside the mold 34. In the last-mentioned variant, the deep-drawn film 12, with the structure 19 mounted thereto, can be passed from an external location on which the structure 19 has been mounted to the film 12, to the mold 34 of FIG. 4.

FIG. 4 shows the state in which the deep-drawn film 12 with the structure 19 mounted thereto is inserted into the lower mold 13.

According to the invention, a mixing head 20 is provided, to which liquid polyurethane casting compound is supplied via a supply line 21, optionally also supplying reinforcing fibers.

A mixture of the polyol panel and the isocyanate panel preferably is carried out only in the mixing head.

To avoid repetition, reference is made to the Applicant's numerous patent applications mentioned above, which explain this mixing operation and the chemical processes in detail.

The mixing head 20 is, as indicated schematically by the movement direction arrow 23, movable over the inner face 16 of the deep-drawn film 12 or over the inner face 18 of the structure 19. A discharge device 22 is assigned to the mixing head 20, with which discharge device the liquid polyurethane casting compound 24 can be dispensed. FIG. 4 shows a state in which only a partial section of the inner face 16, 18 of the deep-drawn film 12 and structure 19 is glazed or wetted with liquid polyurethane molding compound.

The introduction operation of the liquid polyurethane casting compound 24 is completed when a substantially full-surface application is achieved. The invention also comprises when, depending on the adjustment of the viscosity of the polyurethane casting compound 24, an independent, at least partial flow of the liquid polyurethane casting compound 24 also is carried out over the inner face 16, 18 in the course of the introduction operation.

According to the invention, the mold 34 is subsequently closed and the upper mold 14 moved toward the lower mold 13 for this purpose, so that a closed cavity is formed.

Under the action of pressure and temperature, the polyurethane casting compound foams within a predetermined reaction time and forms a cured reinforcement layer 30. The volume of the cured reinforcement layer 30 is considerably greater than the volume of the introduced polyurethane casting compound 24.

Preferably, foaming and curing are carried out with the mold closed.

Figure 5:
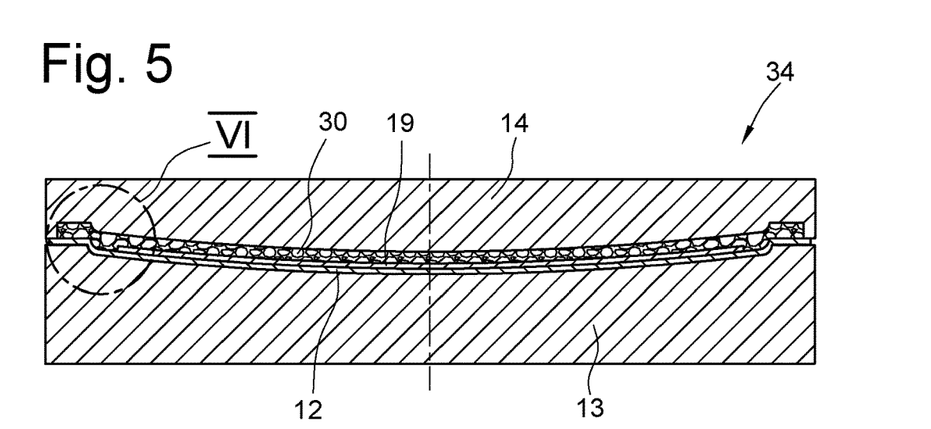

FIG. 5 shows a state in which the reinforcement layer 30 is configured finished, the polyurethane casting compound 24 is thus cured.

Figure 6:
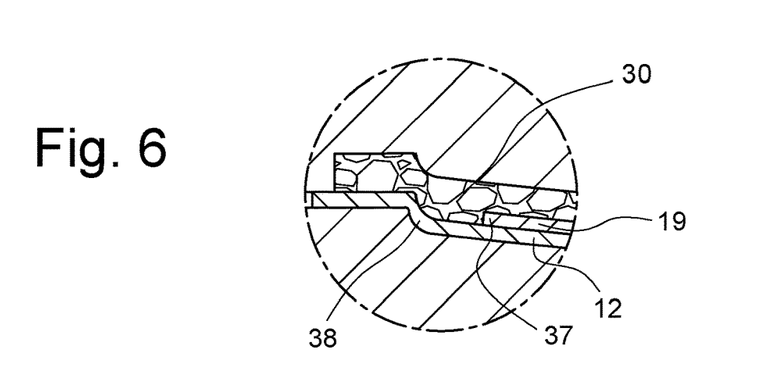

The detailed representation according to FIG. 6 depicts in the edge region, the size ratios of the individual layers, only schematically and by way of example.

The structure 19 can extend with its edge region 37 up to near the edge region 38 of the deep-drawn film 12.

On the other hand, the invention also comprises embodiments in which large distances lie between the edge region 38 of the deep-drawn film 12 and the edge region 37 of the structure 19 containing solar cells 32.

As shown in FIG. 7, the panel 10 thus formed can now be removed from the mold form. FIG. 7 illustrates separation edges 25a, 25b, along which a separation of overhang regions 39a, 39b can be carried out. The overhang regions 39a, 39b are due to the manufacturing method and take into account, for example, that overhangs must be provided for purposes of mold sealing during deep-drawing.

Figure 10:
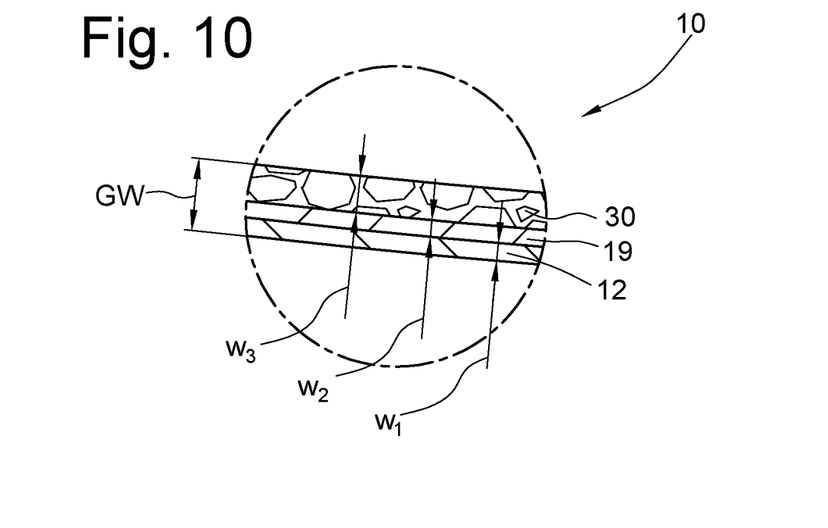

The layer structure of the finished panel 10 according to FIG. 7 can be seen in the partial circle illustration of FIG. 10. Clearly visible are the different wall thicknesses W1 of the deep-drawn film 12, W2 of the structure 19 and W3 of the reinforcement layer 30.

The reinforcement layer 30 stiffens the panel as a whole, so that this is configured to be completely rigid and can be used in a conventional manner, such as a vehicle part, despite the large width B and the large length, not shown, L and the very small total wall thickness GW.

Figure 11:
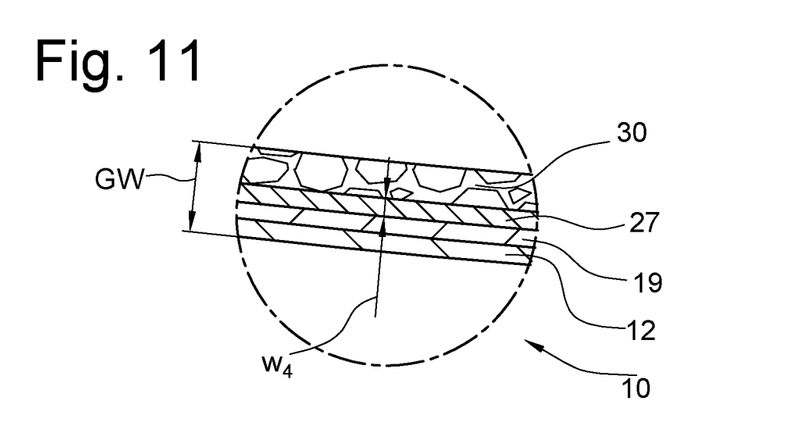

According to a variant of the invention, which is illustrated in FIG. 11, a layer is provided between the structure 19 and the reinforcement layer 30 that is referred to as barrier layer 27. Such a barrier coat is provided by a barrier layer casting compound which is mounted to the inner face 16 of the deep-drawn film 12 or to the inner face 18 of the structure 19 before the polyurethane casting compound 24 is introduced. It is preferably provided that the barrier layer casting compound 27 is cured before the polyurethane casting compound 24 is introduced.

The barrier layer 27 can advantageously serve to avoid a view by an observer of the reinforcement layer 30 from the outer side of the finished made panel 10. Therefore, no structures of the reinforcement layer 30 can be seen on the surface.

Figure 13:
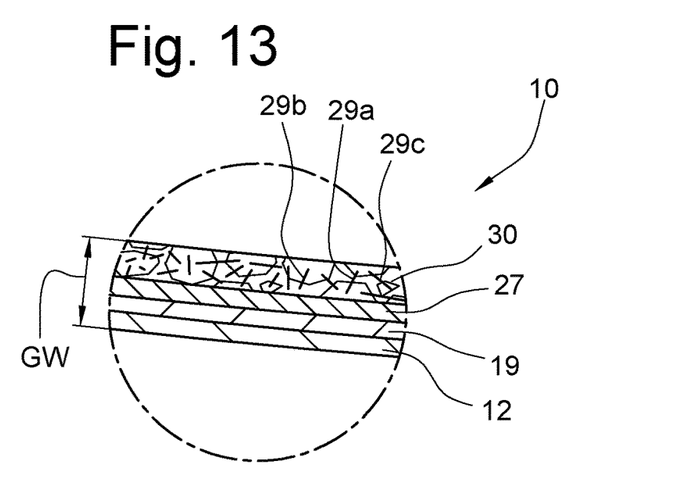

In particular, when, as shown in the embodiment of FIG. 13, reinforcing fibers 29a, 29b, 29c are provided in the liquid polyurethane casting compound 24, for example, as short or long fibers, these fiber structures can not be seen by the presence of the barrier layer 27 on the surface.

Figure 12A:
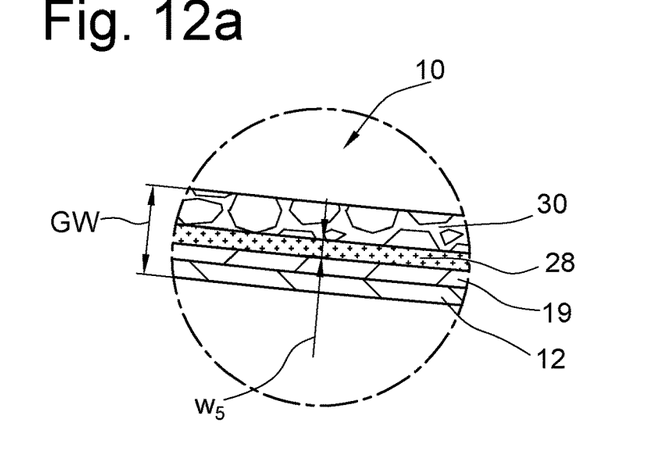

According to a further advantageous embodiment of the invention, as shown in FIG. 12a, it is provided that an in-mold-paint layer 28 is arranged between the structure 19 with the solar cells 32 and the reinforcement layer 30. This is an application of paint, that is, a type of varnish which is mounted to the inner face 16 of the deep-drawn film 12 or on the inner face 18 of the structure 19. This varnish forms an in-mold paint layer 28. Advantageously, an application is carried out on the inner face 16 of the deep-drawn film 12 and on the inner face 18 of the structure 19, before the liquid polyurethane molding compound 34 is mounted. In addition, it is advantageously provided that the in-mold-paint layer 28 first cures before the polyurethane casting compound 24 is mounted.

Figure 12B:
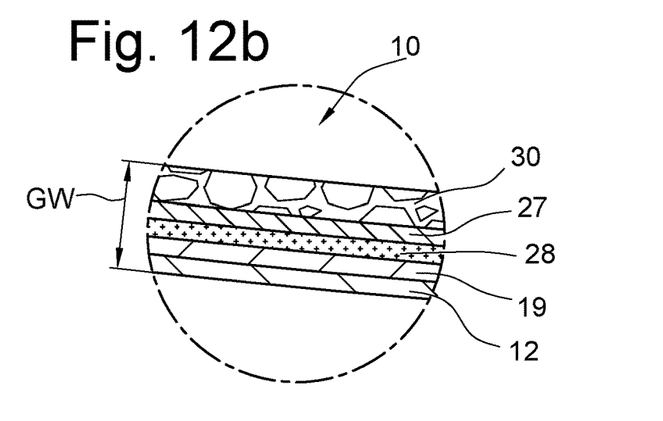

In a further embodiment, not shown, the layer structure of the panel 10 comprises an in-mold-paint layer 28 and additionally a barrier layer 27. Such an embodiment is shown in FIG. 12b.

Figure 8:
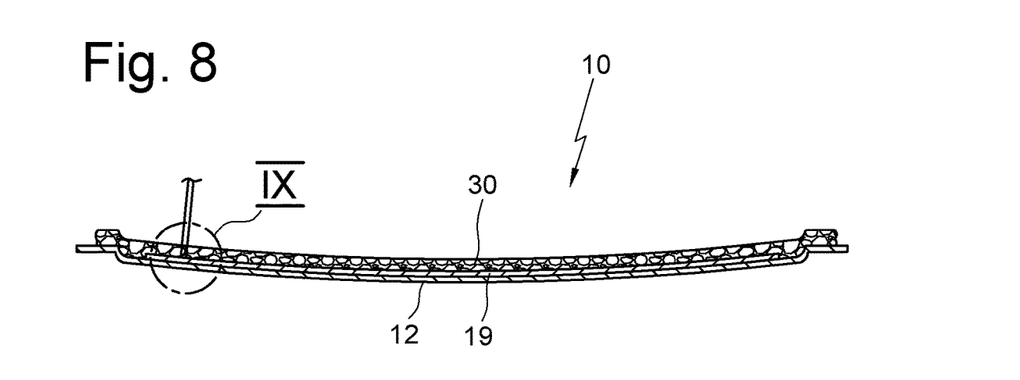
Figure 9A:
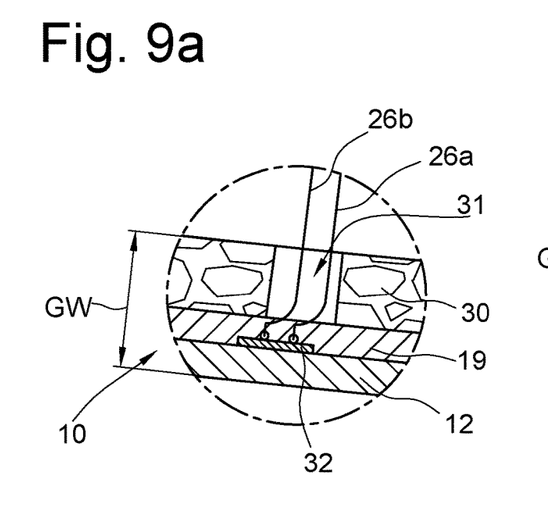
Figure 9B:
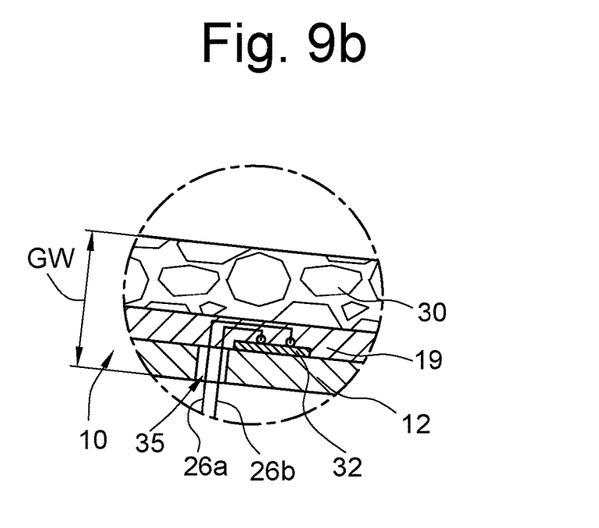

According to a further embodiment of the invention, it is now explained as seen in FIGS. 8, 9a and 9b that the structure 19 having solar cells 32 can also have electrical connection lines 26a, 26b:

FIG. 9a makes schematically clear that the structure 19 has solar cells 32. For the sake of clarity, only a single solar cell 32 in the form of a planar module is shown. This is only to be understood schematically: The structure 19 can consist entirely of solar cells 32, or can comprise a plurality of such solar cells 32. However, the structure 19 can also have a carrier material or a matrix for the solar cells 32.

It is clear to the person skilled in the art that the electromagnetic radiation obtained by the solar cells 32 has to be led away via lines 26a, 26b after conversion into electrical energy. Connection lines 26a, 26b are provided for this purpose that can be connected in a known manner to the solar cell 32 or the solar cells 32. In order to enable the connections from the interior of the vehicle or from the motor compartment or trunk, it is advantageously provided that a channel 31 is provided in the reinforcement layer 30, which channel allows passage of at least sections of the electrical lines 26a, 26b. This makes it possible to provide the connections on the inner face the panel 10, for example, in the region of the interior of the vehicle or in the region of the motor compartment of the vehicle or the trunk of the vehicle.

The arrangement of the channel 31 in the reinforcement layer 30 can be carried out after the manufacture of the reinforcement layer 30. Alternatively, corresponding inserts can also be provided in the manufacturing of the reinforcement layer.

Alternatively, it can be provided that the electrical lines are already mounted after the mounting of the structure 19 on the deep-drawn film 12, and can be surrounded with foam with the introduction of the liquid polyurethane casting compound 24 and the curing to a reinforcement layer 30.

Also, the channel 31 can be configured as a type of receptacle to the plug, a socket or a connecting element, for example, in the manner of a connector.

As shown in the embodiment of FIG. 9b, it is provided that a channel 35 for the passage of sections of the electrical lines 26a, 26b is arranged in the film 12. The lines 26a, 26b are thus led to the exterior here.

This variant is, for example, advantageous when attachments are arranged on the outer side of the panel 10 in order to store electrical energy received from the structure 19 in the attachments or to forward from the attachments or in order to provide supply electricity to electrical consumers arranged on the attachments.

In the following, a family of second variants of the invention is explained based on the embodiments of FIGS. 14 to 18:

These variants fall back to methods according to claim 1, having the feature groups j) and k).

Figure 14:
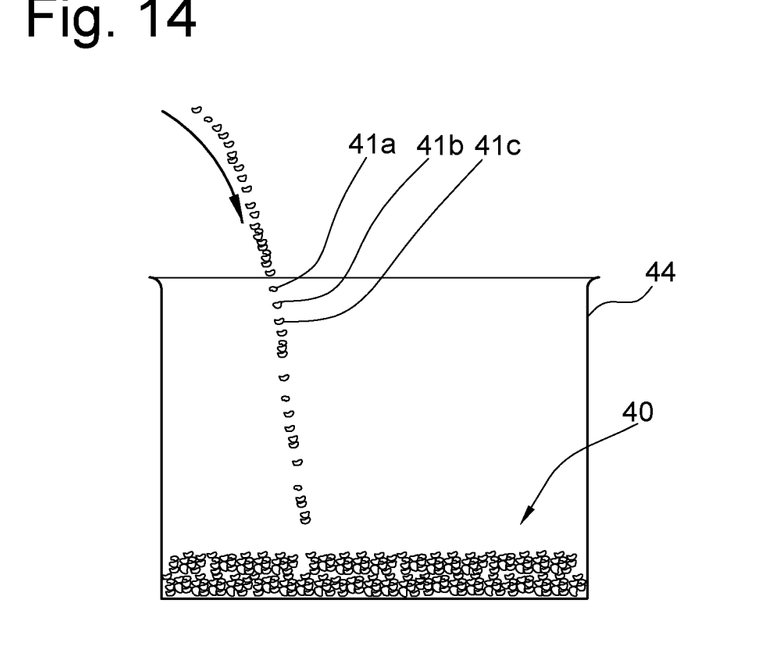

Reference is first made to FIG. 14, which schematically shows a container 44, in which an unfoamed granular particle foam mass 40 is arranged, and is being filled into the container 44. Individual particles are partially designated by reference numerals 41a, 41b, 41c by way of example. The unfoamed granular particles 41a, 41b, 41c can, for example, consist of a foamable plastic of EPS, EPE, or PEEK. The unfoamed granular particles 41a, 41b, 41c have a very small volume, for example, dimensions in the order of 0.1 to 3 mm outer diameter, and can have any geometry, for example, a spherical shape.

Figure 15:
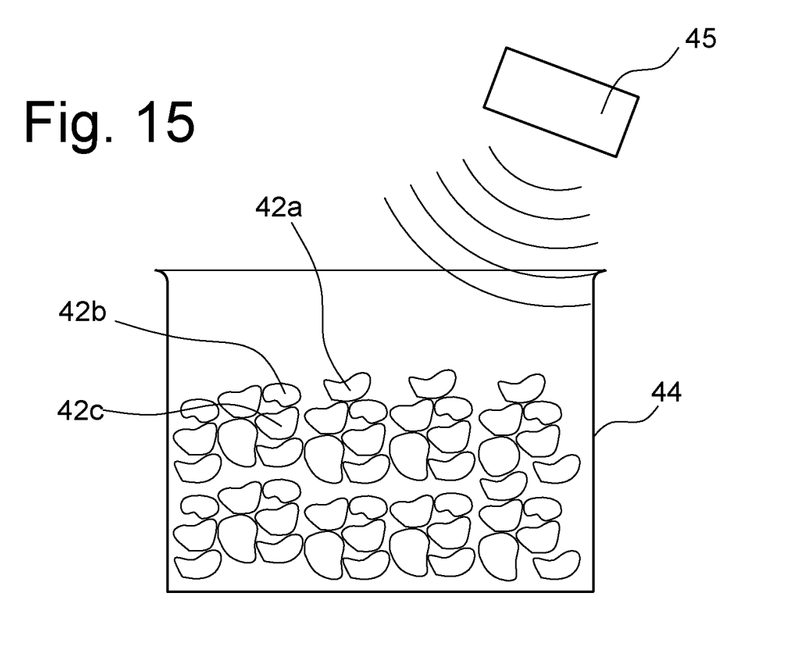

FIG. 15 shows by way of example a foaming device 45, in particular in the manner of an infrared oven. Under the influence of the radiation or temperature applied by the foaming device to the particles 41a, 41b, 41c, the unfoamed granular particles 41a, 41b, 41c can grow to foamed granular particles 42a, 42b, 42c with considerable increase in volume. FIG. 15 shows the foamed granular particles 42a, 42b, 42c with an irregular contour. The invention particularly comprises foamed granular particles which have a spherical shape.

The sum of the foamed granular particles 42a, 42b, 42c constitutes the granular particle foam mass 43 used as starting material for the method according to the invention.

Figure 16:
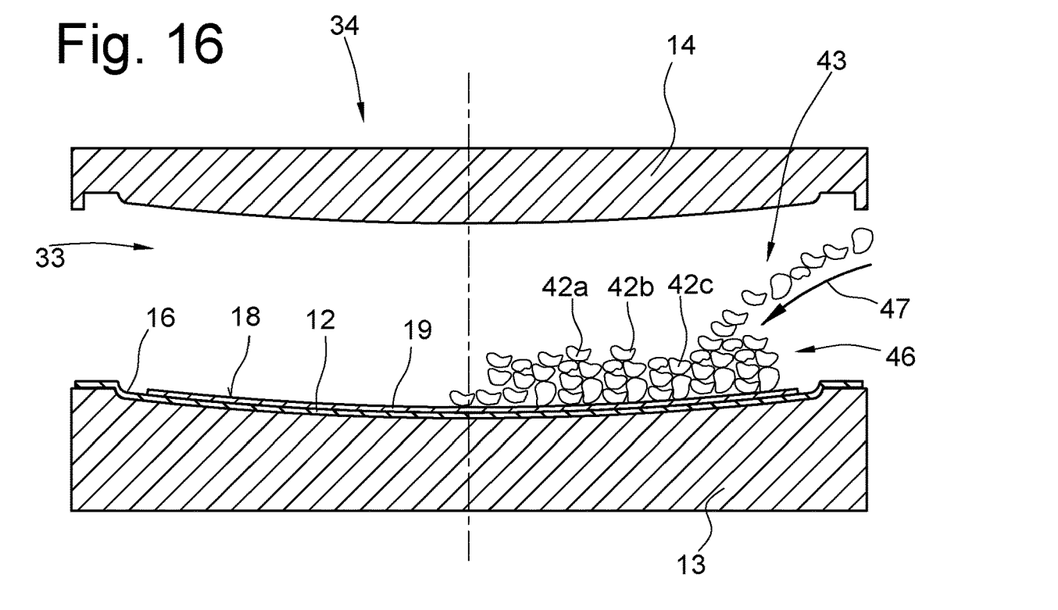

As shown in FIG. 16, in analogy to the description of the embodiment of FIG. 4, to which reference is made in order to avoid repetitions, the deep-drawn film 12 with the structure 19 mounted thereon is inserted into the lower mold 13. When the mold is open, the granular particle foam mass 43 is introduced into the cavity 33 of the mold 34 and spread there.

Subsequently, the mold 34 is closed, wherein the upper mold 14 is moved toward the lower mold 13. With the mold closed, which is tempered by a heating 48, the foamed granular particles 42, 42b, 42c can be baked or sintered to each other. The baking of the granular particle foam mass 43 is carried out under the influence of temperature and/or pressure. The mold 34 can in particular be subject to thermal cycling:

While a higher temperature, in particular above the melting point of the granular particle foam mass 43 is provided in order to perform the process of baking or sintering of the foamed granular particles 42a, 42b, 42c, the mold 34 is either not further heated or cooled (possibly also by a separate cooling device) after a prescribed cycle time, in order to reach a temperature below the melting point of the granular particle foam mass 43.

The cured reinforcement layer 30 formed in this way is provided in this respect by a cured particle foam mass 46.

In the course of baking the foamed particles 42a, 42b, 42c to each other, the particle foam mass also forms a solid connection to the deep-drawn film 12 and to the structure 19 containing the solar cells.

Figure 17:
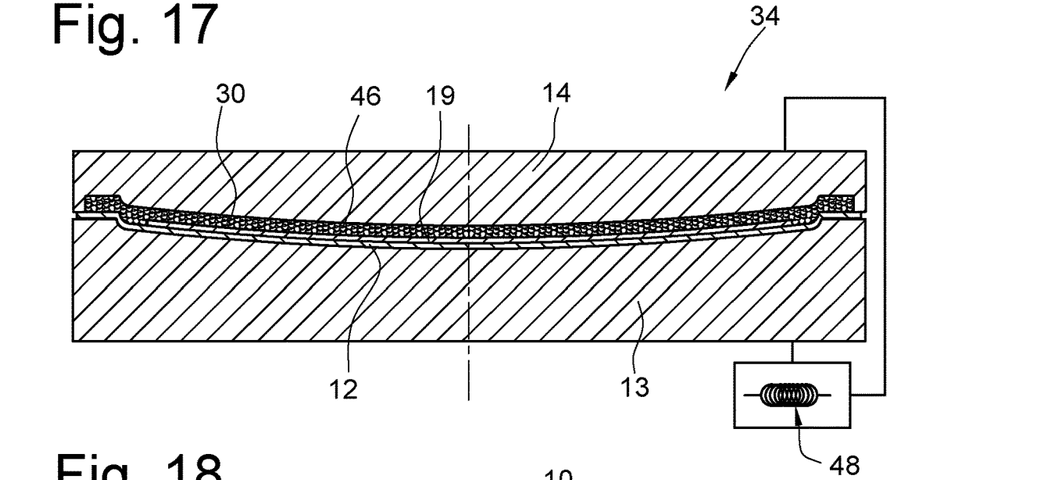
Figure 18:
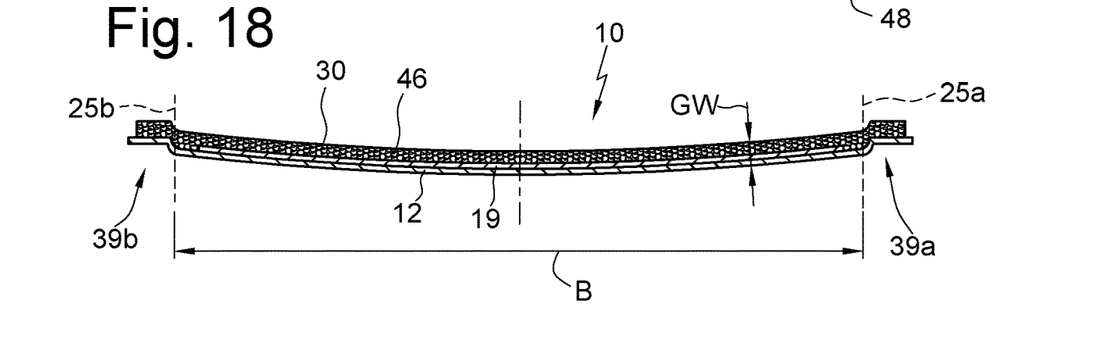

After opening the mold 34, according to FIG. 17, the panel 10 finished in this way can be removed from the mold as shown in FIG. 18.

In order to avoid repetition, reference is made to the above statements regarding the previous embodiments of FIGS. 1 to 13 that apply analogously to the embodiments of FIGS. 16 to 18.

In particular, it is noted that a barrier coat layer 27 and/or a mold-paint layer 28, as is not illustrated in the drawings of the embodiment according to FIGS. 14 to 18, can also be provided in these embodiments.

The invention further comprises when the foamed granular particles 42a, 42b, 42c that form the granular particle foam mass 43, are converted from a prefoamed state into a final foamed state in the course of the step of baking in the mold 34, and thus the step of baking brings with it an increase in volume of the foamed granular particles 42a, 42b, 42c from a pre-foamed state to a final foamed state.

The invention comprises when foamable plastics are used to provide the granular particle foam mass, which are introduced into the mold 34 in a finally foamed state, and thus the step of baking is carried out without volume change of the granular particles 42a, 42b, 42c.

Finally, the invention also comprises when a volume reduction of the foamed granular particles 42a, 42b, 42c is carried out in the course of baking as a result of the pressure effect and/or the effect of temperature in the closed mold 34.

Referring to FIG. 16, it should be noted that the granular particle foam mass 43 can be introduced into the mold 34 along the insertion direction 47 manually or mechanically, wherein a distribution of the foamed granular particles 42a, 42b, 42c can be carried out independently or manually or mechanically and/or automatically over the cavity 33 of the mold.

The invention further comprises an embodiment which provides that the mold 34 is overloaded, that is, an amount of granular particle foam mass is introduced into the cavity 33 of the mold 34, whose volume exceeds the volume of the cavity 33. In the case of a mold closing in the course of the step of baking the granular particles 42a, 42b, 42c, the volume of the granular particles 42a, 42b, 42c can be reduced.

With regard to the embodiment of FIGS. 14 to 18, it should also be noted that the features of the embodiments of FIGS. 1 to 13, for example the mounting of the structures 19 with electrical lines containing the solar cells described on the basis of FIGS. 8 to 9b, can equally be provided.

The invention claimed is:

1. A method comprising the following steps:
   a) providing a deep-drawable film of a transparent plastic,
   b) deep-drawing the film,
   c) mounting a structure having solar cells on an inner face of the deep-drawn film with an inner face of the structure turned away from the film and an outer face of the structure on or closely juxtaposed with the inner face of the film,
   d) placing the deep-drawn film with the mounted structure in a cavity of a mold having at least two mold halves,
   e) introducing foamable granular particles into the cavity of the mold and spreading the granular particles over the inner face of the structure in direct contact with the inner face of the structure without the interposition of an adhesive,
   f) heating the mold and thereby conductively heating and foaming the granular particles in the cavity into a foam mass,
   g) curing the foam mass with the mold closed to form a reinforced panel, and
   h) removing the reinforced panel from the mold.

2. The method according to claim 1, wherein the film consists of polycarbonate or PMMA.

3. The method according to claim 1, further comprising the step of:
   gluing the outer face of the structure on the inner face of the deep-drawn film.

4. The method according to claim 1, wherein before step e) the following step is performed:
   i) introducing a liquid barrier layer casting compound of polyurethane into the cavity of the mold and spreading the barrier layer casting compound over the inner face of the structure or over the inner face of the film, the granular particles being subsequently spread in step e) over the liquid barrier layer.

5. The method according to claim 1, wherein before step e) the following step is performed:
   i) introducing a liquid in-mold-paint casting compound into the cavity of the mold and spreading the in-mold-paint casting compound over the inner face of the structure or over the inner face of the film, the foamable granular particles being subsequently spread in step e) over the casting compound.

6. The method according to claim 5, wherein the step i) is performed after the step of:
   j) introducing a liquid barrier layer casting compound of polyurethane into the cavity of the mold and spreading the barrier layer casting compound over an inner face of the structure or over an inner face of the film.

7. The method according to claim 1, wherein the steps b) and d) and e) are performed in the same mold.

8. The method according to claim 1, wherein the step b) is carried out in a first mold and steps d) and e) are performed in a second mold and the deep-drawn film is passed from the first mold to the second mold after the step b) to perform the steps d) and e).

9. The method according to claim 1, further comprising the step of:
   providing electrical lines connected to the structure.

10. The method according to claim 9, wherein at least a section of the lines passes through the foam mass.

11. The method according to claim 10, wherein the foam mass has a passage for the electrical lines.

12. The method according to claim 1, further comprising the step of:
   using the reinforced panel as an exterior panel for cars, commercial vehicles, trailers, or agricultural machines, or as a roof element, a side wall element, an engine hood, a trunk lid, a fender or a trim part for a vehicle.

13. The method according to claim 1, further comprising the step of:
   using the panel after removal from the mold as a vehicle exterior body part.

\* \* \* \* \*